(12) United States Patent
Fang

(10) Patent No.: US 8,772,157 B2
(45) Date of Patent: Jul. 8, 2014

(54) METHOD OF FORMING CU INTERCONNECTS

(71) Applicant: Jingxun Fang, Shanghai (CN)

(72) Inventor: Jingxun Fang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 13 days.

(21) Appl. No.: 13/667,492

(22) Filed: Nov. 2, 2012

(65) Prior Publication Data
US 2014/0127900 A1    May 8, 2014

(51) Int. Cl.
*H01L 21/768*    (2006.01)
(52) U.S. Cl.
CPC .... *H01L 21/76843* (2013.01); *H01L 21/76802* (2013.01)
USPC ........................................................ 438/653
(58) Field of Classification Search
CPC .................. H01L 21/76843; H01L 21/76846; H01L 21/76855
USPC .......... 438/358, 653, 923, 947; 257/486, 751, 257/377
See application file for complete search history.

(56) References Cited

U.S. PATENT DOCUMENTS

| | | | | |
|---|---|---|---|---|
| 4,959,101 | A * | 9/1990 | MacNeal et al. | 75/685 |
| 6,074,942 | A * | 6/2000 | Lou | 438/632 |
| 6,074,952 | A * | 6/2000 | Liu et al. | 438/706 |
| 6,297,156 | B1 * | 10/2001 | Farrar et al. | 438/687 |
| 6,319,814 | B1 * | 11/2001 | Tsai et al. | 438/624 |
| 2002/0001952 | A1 * | 1/2002 | Chooi et al. | 438/687 |
| 2002/0171147 | A1 * | 11/2002 | Yew et al. | 257/751 |
| 2004/0029041 | A1 * | 2/2004 | Shih et al. | 430/271.1 |
| 2004/0053501 | A1 * | 3/2004 | Brennan et al. | 438/694 |
| 2004/0056359 | A1 * | 3/2004 | Lee et al. | 257/758 |
| 2006/0151887 | A1 * | 7/2006 | Oh et al. | 257/774 |
| 2010/0022084 | A1 * | 1/2010 | Chen et al. | 438/637 |
| 2010/0160542 | A1 * | 6/2010 | Poulton et al. | 524/588 |
| 2011/0291235 | A1 * | 12/2011 | Xiao et al. | 257/532 |

* cited by examiner

*Primary Examiner* — Yuanda Zhang
*Assistant Examiner* — Sheikh Maruf
(74) *Attorney, Agent, or Firm* — Anova Law Group, PLLC

(57) ABSTRACT

The present invention provides a method of forming Cu interconnects. The method comprises depositing an etch stop layer and an insulating layer subsequently; forming vias and trenches in the insulating layer; depositing a diffusion barrier layer and a copper seed layer using PVD; applying electroplating process to form the copper interconnects; depositing a layer of filling materials and reflowing the filling materials to eliminate the uneven surface topography of the copper interconnection layer; and applying annealing and CMP to planarize the top surface of the copper interconnects, and rinsing. According to the method of forming Cu interconnects, the uneven surface topography after electroplating can be reduced, and the surface topography after CMP can be planarized.

9 Claims, 4 Drawing Sheets

METHOD OF FORMING CU INTERCONNECTS

CROSS-REFERENCE TO RELATED APPLICATION

This application claims the priority benefit of China application serial no. 201110307979.3, filed Oct. 12, 2011. All disclosure of the China application is incorporated herein by reference.

FIELD OF THE INVENTION

The present invention relates to a manufacturing method of semiconductor devices, and particularly to a method of forming Cu interconnects.

BACKGROUND OF THE INVENTION

In semiconductor manufacturing process, along with the advance in IC manufacturing process and improvement in integration degree of chips, the copper interconnection has replaced the aluminum interconnection as the main tridimensional interconnection in VLSI. As the substitute of aluminum interconnection, the copper interconnection has many advantages: firstly, the resistivity of copper is lower than that of aluminum, and the coupled delay of copper subsequent-interconnection is also less than that of aluminum subsequent-interconnection, which is propitious to promote the device performance and reduce the power consumption. Secondly, since the cross section area of the copper interconnection is less than that of the aluminum interconnection, the parasitical capacitance between the adjacent wirings is reduced under the same current condition, which decreases the signal crosstalk. Furthermore, the resistance to electromigration of copper is better than that of aluminum, which would avoid the problem of forming voids in the interconnect, and the device reliability can be enhanced. In conclusion, the application of the copper interconnection can increase the integration degree of chips, the device density, the clock frequency, and reduce the power consumption and cost.

Due to the difficulties in etching copper, dual-Damascene process is generally introduced in the copper interconnection conventionally. The dual-Damascene process comprises the following steps:

Step 1: depositing a thin etch stop layer;

Step 2: depositing a insulating layer with certain thickness on the etch stop layer;

Step 3: applying corresponding photolithography and etching process to form integral vias and trenches;

Step 4: sputtering a diffusion barrier layer and depositing a copper seed layer using PVD;

Step 5: electroplating on the copper seed layer to form the copper interconnects;

Step 6: applying annealing and chemical and mechanical polishing (CMP) to planarize the copper electroplating layer and rinsing.

Repeating the processes including step 1 to step 6 mentioned above, a stack of multiple copper interconnection layers can be formed. According to Faraday's law, in the process of electroplating, electrolytic solution containing sulfate electrolyte is utilized, and electrical power source is applied to the anode (copper) and the cathode (silicon wafer) of the electroplating bath to form an electric field and electric current in the solution. The copper losing electrons at the anode may transfer to copper ions, and copper ions adjacent to the cathode may transfer to copper atoms by gaining electrons on the silicon wafer surface and be deposited on the silicon wafer surface. Under the application of an electric field, the copper ions may move directionally from the anode to the cathode and compensate the concentration depletion adjacent to the cathode. By controlling the deposition of the copper electroplating film through current regulation and distribution, a compact and homogeneous distributed copper layer without cavities, gaps or other defects can be deposited on the silicon wafer.

In order to form a copper film having better consistency and uniformity, the current densities for the whole copper interconnection layer surface are required to have less difference in the electroplating process. Due to the shrinking in IC critical dimension and the increase in depth-width ratio of the trenches, the filling performance of the trenches, the quality of the electroplated layers and the topography of the copper interconnection layer after electroplating can be affected by a plurality of factors, such as: the post-etch profile, the thickness of the seed layer, the main salt concentration, the pH value, the current parameter, the temperature, and organic additives (accelerator, suppressor and leverler), etc. Wherein, the filling performance is closely related to the composition and the concentration of the organic additives. The first consideration for optimizing the electroplating process is how to promote the properties related to conductivity and reliability such as filling performance, compactness, crystal grain size and defect. The control of the electroplated topography may not be the key point of electroplating process in the past.

However, as known to all, the CMP process after electroplating is the indispensable technique for implementing copper subsequent-interconnection. As shown in FIG. 1, which is a sectional view of the copper interconnection layer to show the topography of the copper interconnection layer surface after copper CMP, dishing and erosion are the main defects induced by copper CMP (for simplicity, only one copper interconnection layer is illustrated herein). Such defects could affect the planarization of the chip surface and reduce the effective thickness of the copper wirings which may result in the increase in the resistivity of the copper wirings. Furthermore, due to the accumulation of the dishing and erosion defects, copper residues may be formed in the subsequent metal interconnection layer, which may result in short circuit between the copper wirings and decrease in the chip yield or even chip rejection. Therefore, reducing dishing and erosion in copper CMP is very important to the copper interconnection technique. Dishing and erosion in copper CMP can be caused by the following two aspects.

In one aspect, during the over-polishing process of copper CMP, copper is exposed in the interconnection regions of the copper interconnection layer surface, and the insulating dielectric and the diffusion barrier layer thereon are exposed in the isolation regions. The removal rates during the CMP process are different according to different materials. The ratio of the removal rate of one material to the removal rate of another material is called the "selectivity ratio". Generally, the removal rate of copper is higher than that of the insulating dielectric and the diffusion barrier layer thereon, thus the removal of the copper in the copper interconnection region is more than the removal in the insulating dielectric region. Dishing and erosion can be reduced by using proper slurry and pad, and optimizing the process condition of CMP.

In the other aspect, as shown in FIG. 2, due to the loading effects during the process of electroplating, the copper surface formed by electroplating before copper CMP is not planarized. The unplanarization can be caused by the native uneven topography of the trench structure as well as the special effect of the electroplating process such as the over-electroplating effect, which may cause the copper electroplated thicker in dense region of the wirings. As shown in FIG. 3, the typical topography differences in different regions after electroplating can be denoted clearly by surface scanning through the Atom Force Microscope (AFM). The surface topography after electroplating is determined by the design rules and the layout, and the surface topography of different regions may be different, thus the copper need to be removed in the respective regions are different accordingly and the CMP process can be affected. Furthermore, the surface topography of the copper interconnection layer after electroplating may also affect the CMP process directly in another aspect. Due to the topography unevenness, the local pressures subjected by the respective regions during the CMP process are different, which may result in different time span for removing the copper with the same thickness over the insulating dielectric/diffusion barrier layer (Ta/TaN) in the different regions. As shown in FIG. 4, the change of the surface topography of the copper interconnection layer during the actual removal process is illustrated. Different time span means that some regions may be subjected to a shorter time span of removal, while some regions may be subjected to a longer time span of removal, which is prone to form dishing and erosion. As can be seen, the electroplated surface topography may affect CMP process in many ways, and dishing and erosion are more likely to be formed. Although the unevenness of the electroplated surface can be eliminated by designing the pattern layout properly, such as adding redundant metal, so as to reduce dishing and erosion, however, it may be limited by the design rules and the electricity requirement of the device and may not be effective always.

SUMMARY OF THE INVENTION

Accordingly, at least one objective of the present invention is to provide a method of forming Cu interconnects to reduce dishing and erosion, which may result in the increase in the resistivity of the copper wirings, the short circuit between the wirings and decrease in chip yield or even chip rejection in the copper CMP process.

To achieve these and other advantages and in accordance with the objective of the invention, as embodied and broadly described herein, the invention provides a method of forming Cu interconnects. The method comprises the following steps:

Step 1: depositing an etch stop layer;

Step 2: depositing an insulating layer with certain thickness on the etch stop layer;

Step 3: applying photolithography and etching process to the insulating layer to form vias and trenches in the insulating layer;

Step 4: depositing a diffusion barrier layer and depositing a copper seed layer on the diffusion barrier layer using PVD;

Step 5: applying electroplating process to the top surface of the copper seed layer to form the copper interconnects;

Step 6: depositing a layer of filling materials and reflowing the filling materials to eliminate the uneven surface topography of the copper interconnection layer; and Step 7: applying annealing and CMP to planarize the top surface of the copper interconnects, and rinsing.

In the process mentioned above, the filling materials are chosen from one of the metal alloy materials, macromolecule polymer materials, or compound materials of metal alloy and macromolecule polymer.

In the process mentioned above, the melting point of the filling materials is in the range from 100 degree Celsius to 900 degree Celsius.

In the process mentioned above, the metal alloy materials are composed of two or more metals including magnesium, aluminum, copper, zinc, indium, stannum, stibium, and plumbum, and accompanied by one or more trace impurity elements, wherein the trace impurity elements comprise sulfur or arsenic.

In the process mentioned above, the macromolecule polymer is a polymer or co-polymer formed by addition or condensation polymerization of one or more monomers.

In the process mentioned above, the reflowing process is performed by heating and spinning to fill the recessed surface topography of the copper interconnection layer with the filling materials deposited on the copper interconnects.

In the process mentioned above, the step 6 of applying CMP process further comprises:

Step 61, removing all the filling materials and parts of the copper interconnects on the diffusion barrier layer with the same removal rate;

Step 62, removing all the copper interconnects on the top surface of the insulating layer with high selectivity ratio of copper to the diffusion barrier layer, and stopping on the diffusion barrier layer; and Step 63, removing the entire diffusion barrier layer on the top surface of the insulating layer.

In the process mentioned above, the material of the diffusion barrier layer is Ta/TaN or Ru.

In the process mentioned above, the material of the insulating layer is silicon oxide or low-k dielectric substance.

In the process mentioned above, the material of the etch stop layer is SiC, SiCN or SiN.

According to the method of forming Cu interconnects of the present invention, the uneven surface topography after electroplating on copper can be eliminated by depositing filling materials of low melting points, good wettability and adhesive capacity of copper, and applying a reflowing process. Furthermore, the filling materials, the over-filled copper on the insulating layer and the diffusion barrier layer can be removed during the CMP process and the surface topography of the copper interconnection layer after CMP can be planarized.

BRIEF DESCRIPTION OF THE DRAWINGS

The method of forming Cu interconnects of the present invention will be elucidated by reference to the following embodiments and the accompanying drawings, in which.

DETAILED DESCRIPTION OF THE EMBODIMENTS

The operation and fabrication of the presently preferred embodiments are discussed in further details hereinafter with respect the embodiments and the accompanying drawings. However, the embodiments described herein are not the only applications or uses contemplated for the invention. The specific embodiments discussed are merely illustrative of specific ways to make and use the invention, and do not limit the scope of the invention or the appended claims.

Figure 1:
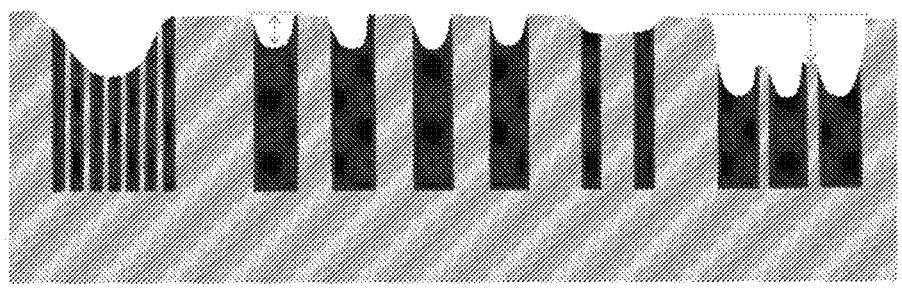
FIG. 1 is a sectional view of the copper interconnection layer to show the dishing and erosion effect after CMP in prior art.
Figure 2:
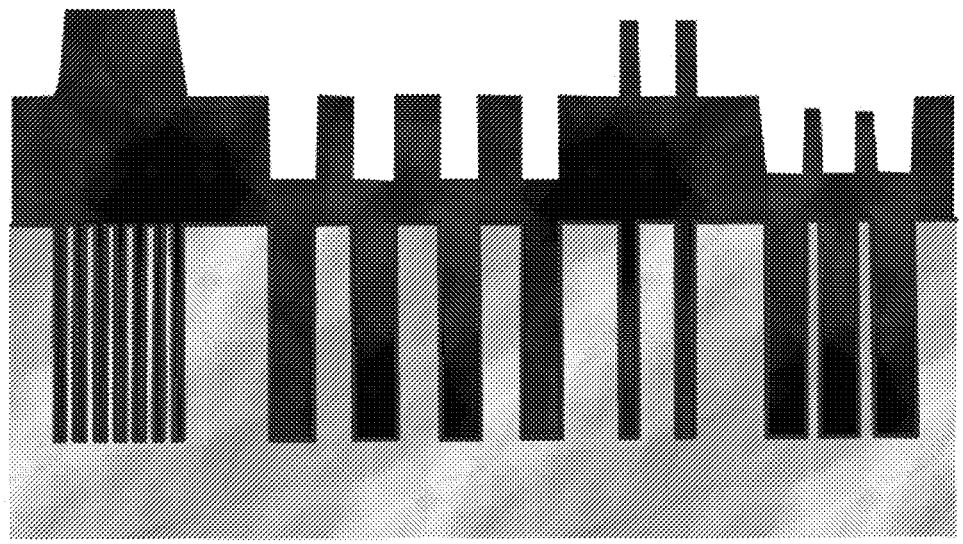
FIG. 2 is a sectional view of the copper interconnection layer to show the surface topography of the copper interconnection layer after the process of the copper electroplating in prior art.
Figure 3:
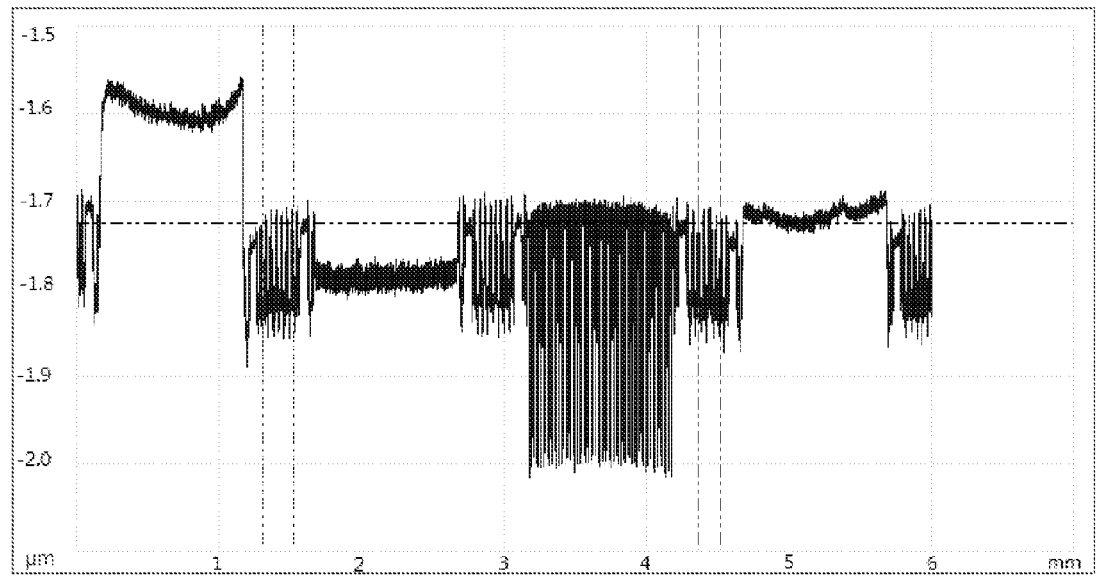
FIG. 3 is a schematic diagram of atom force microscope images of the surface topography of the copper interconnection after the process of the copper electroplating in prior art.
Figure 4:
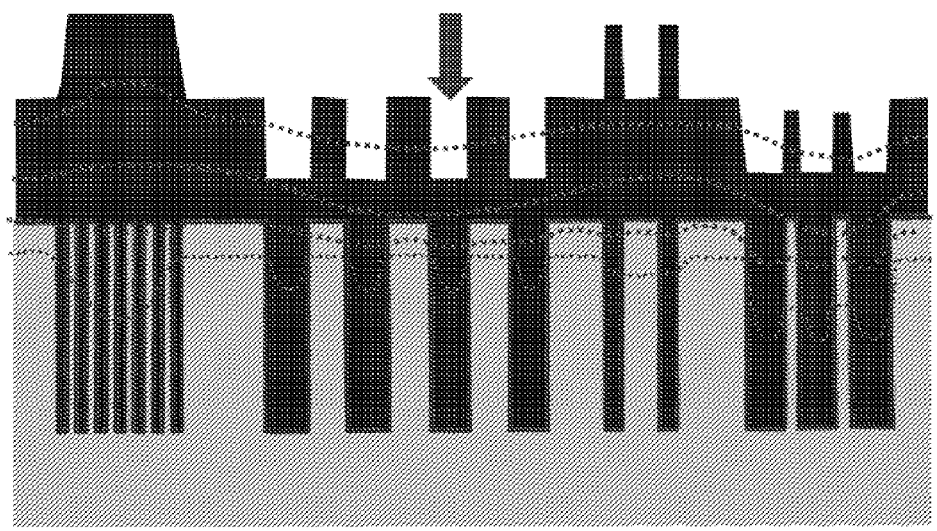
FIG. 4 is a sectional view of the copper interconnection layer to show the change of the surface topography of the copper interconnection layer during the process of CMP in prior art.
Figure 5:
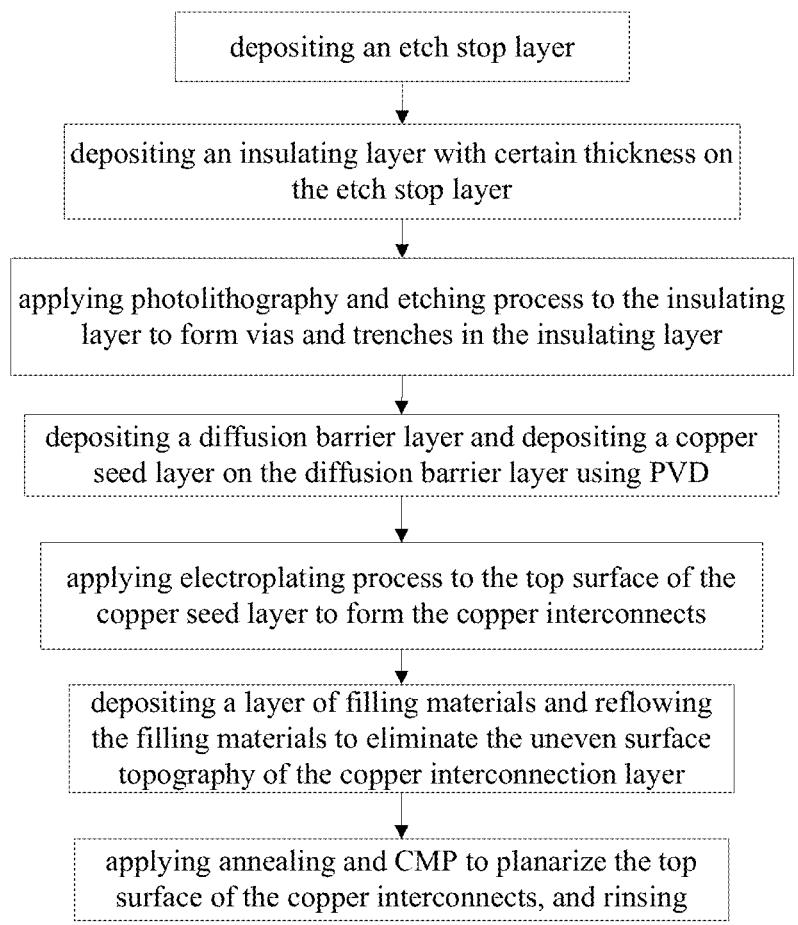
FIG. 5 is a schematic flow chart showing a method of forming Cu interconnects according to a preferred embodiment of the present invention.

The method of forming Cu interconnects according to the present invention, as shown in FIG. 5, may comprise the steps of:

Step 1: depositing an etch stop layer;
Step 2: depositing an insulating layer with certain thickness on the etch stop layer;
Step 3: applying photolithography and etching process to the insulating layer to form vias and trenches in the insulating layer;
Step 4: depositing a diffusion barrier layer and depositing a copper seed layer on the diffusion barrier layer using PVD;
Step 5: applying electroplating process to the top surface of the copper seed layer to form the copper interconnects;
Step 6: depositing a layer of filling materials and reflowing the filling materials to eliminate the uneven surface topography of the copper interconnection layer;
Step 7: applying annealing and CMP to planarize the top surface of the copper interconnects, and rinsing.

The processes of forming Cu interconnects in step 1~step 5 and step 7 may be accomplished by those used in the prior art. In accordance with embodiments of the present invention, a process of depositing and reflowing filling materials (step 6) is added in the Cu interconnects formation. In this way, the surface topography of the copper interconnection layer after CMP can be planarized (shown in FIG. 6 and FIG. 7). The present invention addresses and solves the dishing and erosion problems encountered upon the CMP process.

Figure 6:
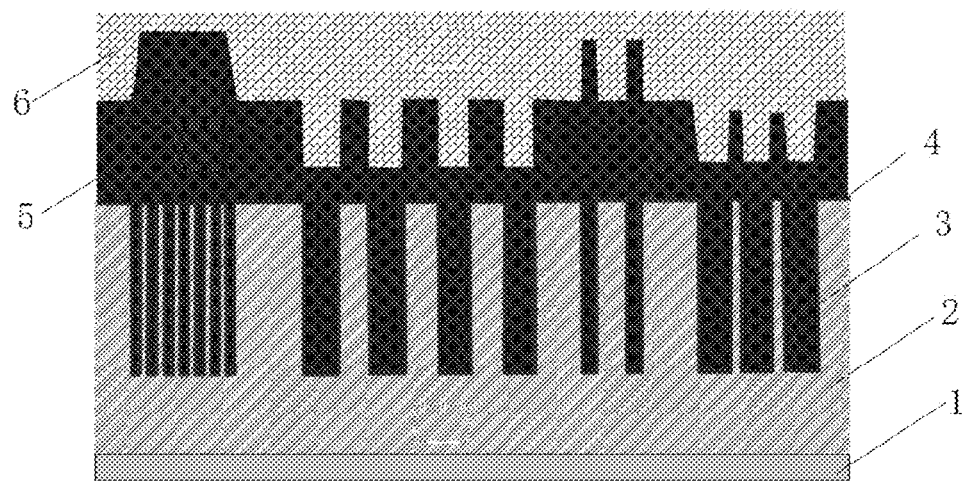
FIG. 6 is sectional view of the copper interconnection layer after the process of depositing and reflowing filling materials in one embodiment of the present invention.
Figure 7:
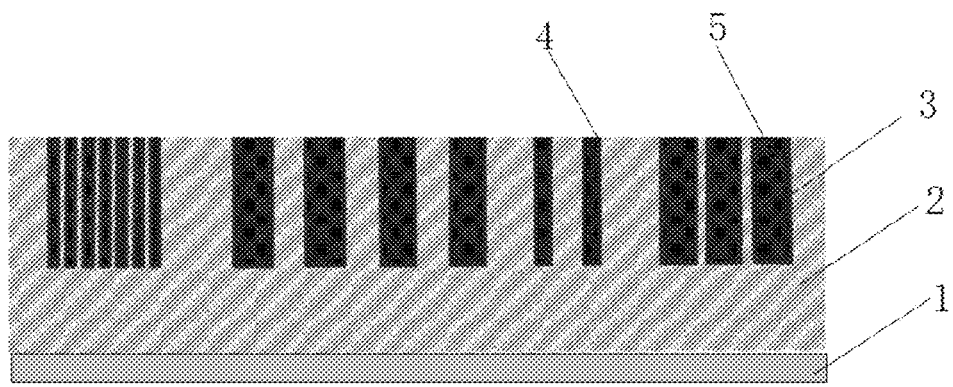
FIG. 7 is a sectional view of the surface topography after the process of copper CMP in an embodiment of the invention.

FIG. 6 shows the copper interconnection layer after the process of depositing and reflowing filling materials, and FIG. 7 shows the copper interconnection layer after the process of CMP in accordance with the invention.

The processing steps according to the present invention will be described in details hereinafter by referring to FIGS. 6 and 7. Firstly an etch stop layer 1 is deposited, and an insulating layer 2 with certain thickness is deposited on the etch stop layer 1 subsequently. Wherein, the material of the etch stop layer 1 can be SiC, SiCN or SiN, and the material of the insulating layer 2 can be silicon oxide or low-k dielectric substance. Then, the vias and trenches 3 are formed in the insulating layer 2 by photolithography and etching process to the insulating layer 2. Afterwards, a diffusion barrier layer 4 and a copper seed layer are deposited subsequently using PVD, wherein, the material of the diffusion barrier layer 4 can be Ta/TaN or Ru. Then, electroplating process is applied to the top surface of the copper seed layer to form the copper interconnects 5. After that, filling materials are deposited and reflowed to eliminate the uneven surface topography of the copper interconnection layer 5. Specifically, a layer of filling materials is deposited on the copper interconnects 5 first, and then the filling materials are filled in the recessed surface topography of the copper interconnection layer 5 by heating and spinning under the effect of gravity and surface tension.

The filling materials 6 can be chosen from one of the metal alloy materials, macromolecule polymer materials, or compound materials of metal alloy and macromolecule polymer and so on, and the melting point of the filling materials 6 can be in the range from 100 degree Celsius to 900 degree Celsius. Therefore, the filling materials 6 can have good fluidity and filling capability. In some embodiment of the present invention, the macromolecule polymer can be a polymer or copolymer formed by addition or condensation polymerization of one or more monomers; the metal alloy materials can be composed of two or more metals including magnesium, aluminum, copper, zinc, indium, stannum, stibium, and plumbum, etc., and accompanied by one or more trace impurity elements, wherein the trace impurity elements can be sulfur or arsenic. As shown in FIG. 5, after filling materials 6 being deposited and reflowed, the unevenness of the surface topography of the copper interconnection layer can be reduced. Then, the CMP process is applied.

The CMP process comprises three stages. In the first stage, all the filling materials 6 and parts of the copper interconnects 5 on the diffusion barrier layer 4 are removed with the same removal rate; in the second stage, all the copper interconnects 5 on the top surface of the insulating layer 2 are removed with high selectivity ratio of copper to the diffusion barrier layer 4; and in the last stage, the entire diffusion barrier layer 4 on the top surface of the insulating layer 2 is removed, wherein, the removal rate can be controlled according to the slurry and the process condition. As shown in FIG. 6, after the CMP process, the surface topography of the copper interconnection layer is planarized. Finally, a stack of multiple copper interconnection layers with planarized surface topography can be formed by repeating the processes mentioned above.

In summary, the method of forming Cu interconnects reduces the unevenness of the surface topography of the chip; increases the effective thickness of the copper wirings and decreases the resistivity of the copper wirings. Furthermore, the accumulation of dishing and erosion defects can also be reduced so as to prevent the copper residues forming in the subsequent metal layer and avoid the short circuit between the copper wirings. Therefore, chip yield can be greatly increased and the occurrence of chip rejection can be reduced.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of forming Cu interconnects comprising:
Step 1: depositing an etch stop layer;
Step 2: depositing an insulating layer with certain thickness on the etch stop layer;
Step 3: applying photolithography and etching process to the insulating layer to form vias and trenches in the insulating layer;
Step 4: depositing a diffusion barrier layer and depositing a copper seed layer on the diffusion barrier layer using PVD;
Step 5: applying electroplating process to the top surface of the copper seed layer to form the copper interconnects;
Step 6, depositing a layer of filling materials adhering to copper and then reflowing the filling materials to eliminate the uneven surface topography of the copper interconnects, wherein the step 6 of applying CMP process further comprised:

Step 61, removing all the filling materials and parts of the copper interconnects on the diffusion barrier layer with the same removal rate;

Step 62, removing all the copper interconnects on the to surface of the insulating layer with high selectivity ratio of copper to the diffusion barrier layer, and stopping on the diffusion barrier layer; and Step 63, removing the entire diffusion barrier layer on the to surface of the insulating layer; And Step 7, applying annealing and CMP to planarize the top surface of the copper interconnects, and rinsing.

2. The method according to claim 1, wherein, the filling materials are chosen from one of the metal alloy materials, macromolecule polymer materials, or compound materials of metal alloy and macromolecule polymer.

3. The method according to claim 1, wherein, the melting point of the filling materials is in the range from 100 degree Celsius to 900 degree Celsius.

4. The method according to claim 2, wherein, the metal alloy materials are composed of two or more metals including magnesium, aluminum, copper, zinc, indium, stannum, stibium, and plumbum, and accompanied by one or more trace impurity elements, wherein the trace impurity elements comprise sulfur or arsenic.

5. The method according to claim 4, wherein, the macromolecule polymer is a polymer or co-polymer formed by addition or condensation polymerization of one or more monomers.

6. The method according to claim 1, wherein, the reflowing process is performed by heating and spinning to fill the recessed surface topography of the copper interconnects with the filling materials deposited on the copper interconnects.

7. The method according to claim 1, wherein, the material of the diffusion barrier layer is Ta/TaN or Ru.

8. The method according to claim 1, wherein, the material of the insulating layer is silicon oxide or low-k dielectric substance.

9. The method according to claim 1, wherein, the material of the etch stop layer is SiC, SiCN or SiN.

* * * * *